(12) United States Patent
Koto et al.

(10) Patent No.: US 7,558,811 B2
(45) Date of Patent: Jul. 7, 2009

(54) ELECTRONIC CONTROL APPARATUS AND MEMORY APPARATUS FOR ELECTRONIC CONTROL APPARATUS

(75) Inventors: Kazuhiro Koto, Kariya (JP); Tadaharu Nishimura, Oobu (JP)

(73) Assignee: Denso Corporation, Kariya, Aichi-pref. (JP)

( * ) Notice: Subject to any disclaimer, the term of this patent is extended or adjusted under 35 U.S.C. 154(b) by 702 days.

(21) Appl. No.: 10/764,583

(22) Filed: Jan. 27, 2004

(65) Prior Publication Data
US 2004/0186866 A1  Sep. 23, 2004

(30) Foreign Application Priority Data
Jan. 27, 2003   (JP)  ............... 2003-017546

(51) Int. Cl.
*G06F 15/00* (2006.01)
*G06F 7/38* (2006.01)

(52) U.S. Cl. .............. 708/204; 708/200; 708/290

(58) Field of Classification Search ......... 708/200–209, 708/523, 490, 620, 204, 290
See application file for complete search history.

(56) References Cited

U.S. PATENT DOCUMENTS

| | | | |
|---|---|---|---|
| 5,638,312 A * | 6/1997 | Simone | ............ 708/204 |
| 5,682,896 A | 11/1997 | Scheib et al. | |
| 5,751,611 A | 5/1998 | Jamieson | |
| 6,049,343 A * | 4/2000 | Abe et al. | ............ 708/204 |
| 6,144,977 A * | 11/2000 | Giangarra et al. | ............ 708/204 |
| 6,460,135 B1 | 10/2002 | Suganuma | |
| 6,671,796 B1 * | 12/2003 | Sudharsanan et al. | ....... 708/204 |
| 6,757,700 B1 * | 6/2004 | Druck | ............ 708/204 |
| 6,873,324 B2 * | 3/2005 | Saito et al. | ............ 345/419 |
| 7,216,138 B2 * | 5/2007 | Abdallah et al. | ............ 708/204 |
| 2001/0055032 A1 | 12/2001 | Saito et al. | |

(Continued)

FOREIGN PATENT DOCUMENTS

JP          63-223825 A          9/1988

(Continued)

OTHER PUBLICATIONS

Belanovic et al., "A Library of Parameterized Floating-Point Modules and Their Use", Field-Programmable Logic and Applications, Reconfigurable Computing is Going Mainstream, 12th International Conference, FPL 2002. Proceedings (Lecture Notes in Computer Science vol. 2438), Springer-Verlag Berlin, Germany, 2002, pp. 657-666, XP002396276.

(Continued)

*Primary Examiner*—Chat C Do
(74) *Attorney, Agent, or Firm*—Nixon + Vanderhye PC

(57) ABSTRACT

An electronic control apparatus has a memory which stores a map consisting of a set of map points and corresponding set of map values, with the map values representing respective physical quantity values, and at least one of the sets of map points and map values being stored as fixed-point representation data. When a map point is specified, the apparatus obtains a corresponding physical quantity value by converting fixed-point data of the map to floating-point representation, then using a floating-point arithmetic unit to perform an interpolation calculation using the converted data.

7 Claims, 7 Drawing Sheets

U.S. PATENT DOCUMENTS

2003/0065698 A1*  4/2003  Ford .......................... 708/204
2004/0128331 A1*  7/2004  Hinds et al. ................. 708/204

FOREIGN PATENT DOCUMENTS

| | | |
|---|---|---|
| JP | 3-14128 A | 1/1991 |
| JP | 2000-112757 A | 4/2000 |
| JP | 2001-195233 A | 7/2001 |
| JP | 2001-282505 A | 10/2001 |
| JP | 2002-8060 A | 1/2002 |
| JP | 2002-157004 A | 5/2002 |

OTHER PUBLICATIONS

Japanese Office Action dated Sep. 11, 2007 in Application No. 2003-017546, with English translation.

EPO Search Report dated Sep. 25, 2006.

* cited by examiner

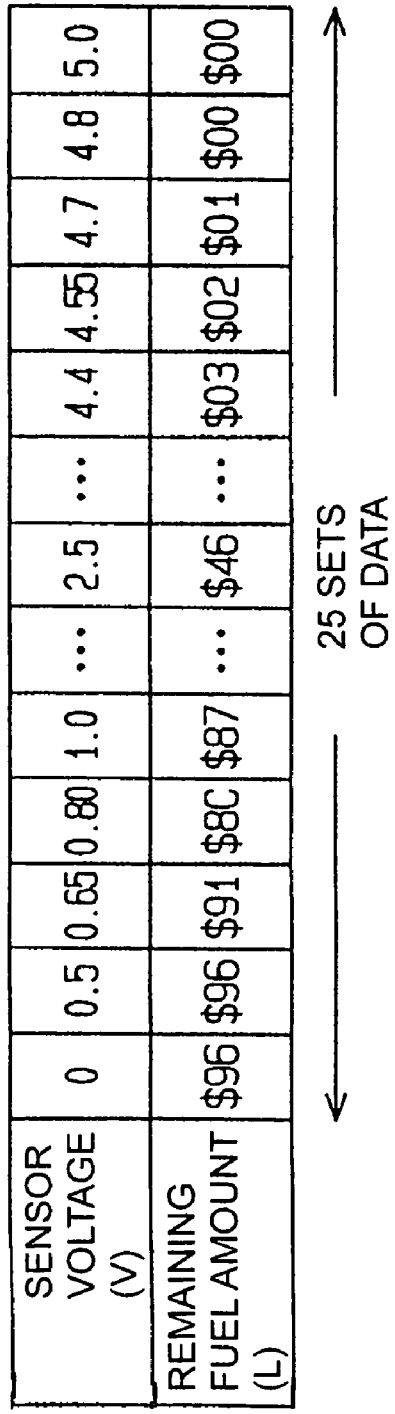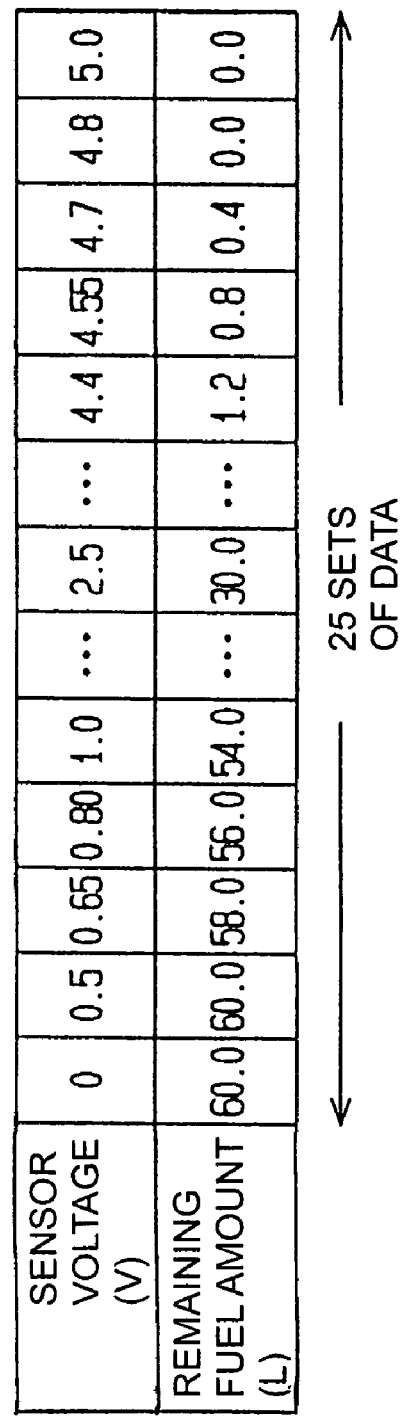

ically in Japanese patent No. 2001-282505. Use of floating-point data enables a higher level of calculation accuracy to be attained than is possible with fixed-point data.

ELECTRONIC CONTROL APPARATUS AND MEMORY APPARATUS FOR ELECTRONIC CONTROL APPARATUS

BACKGROUND OF THE INVENTION

1. Field of the Invention

The present invention relates to an electronic control apparatus, and to a memory apparatus of the electronic control apparatus, with the electronic control apparatus having a floating-point arithmetic function and performing various types of calculation and control operations by execution of a predetermined program.

2. Description of Related Art

In recent years, types of electronic control apparatus for performing functions such as controlling the engine or other equipment of a vehicle have come into use, whereby data expressed in floating-point representation are used in performing various types of processing, instead of data expressed in fixed-point representation. This is described for example in Japanese patent No. 2001-282505. Use of floating-point data enables a higher level of calculation accuracy to be attained than is possible with fixed-point data.

Figure 8:
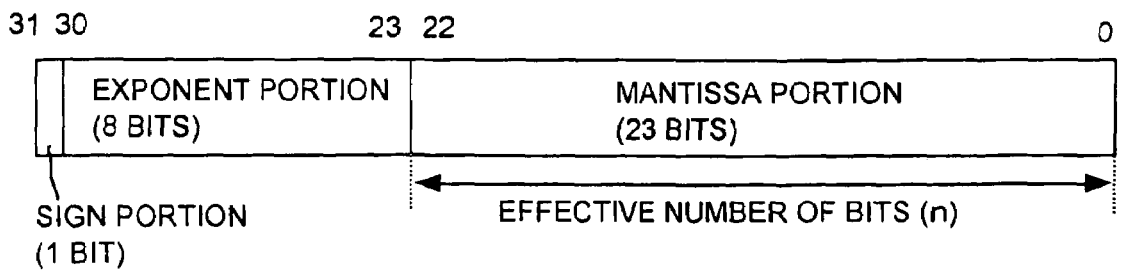

FIG. 8 shows the single precision storage format for data in accordance with the IEEE754 standard, which is one of the standards for floating-point data. As shown in FIG. 8, the single precision storage format consists of 4 bytes, i.e., a sign portion which is a single bit, an 8-bit exponent, and a 23-bit mantissa. Due to the fact that the mantissa is formed of 23 bits with this single precision format, it is possible to perform calculations to an accuracy of $\frac{1}{2}^{23}$ ($\cong 0.0000001$), i.e., with 7 digits below the radix point.

Usually with such a type of electronic control apparatus which must be executed using various types of control, the apparatus incorporates a ROM (read-only memory) for storing respective sets of map data of one or more maps. Each set of map data expresses relationships between a set of map points (i.e., input values for the map) and a corresponding set of map values (i.e., from which output results can be obtained, in response to map points being specified). Specifically, an output result is obtained in response to a specific map point, based on a map value which directly corresponds to that map point, or based on interpolation between a plurality of map values that are adjacent to the map point.

However when such a map is configured with all of the map data being stored as floating-point representation data, then the amount of stored data may become large. For example, if all of the map data are stored as single precision storage format data, then it is necessary to use 4 bytes of data for each map point and 4 bytes for each map value. Hence, the required ROM storage capacity becomes excessive. In recent years, due to the increasing complexity of control of vehicle engines, the amount of data which must be stored in such a ROM has increased accordingly, so that this problem is becoming more severe.

SUMMARY OF THE INVENTION

It is an objective of the present invention to overcome the problems of the prior art described above, by providing an electronic control apparatus and a memory apparatus of the electronic control apparatus, whereby map data that are held stored in the memory apparatus are used in the form of floating-point data during processing by the electronic control apparatus but whereby the amount of data that must be held stored in the memory apparatus can be reduced.

In the following, it is to be understood that unless otherwise indicated, the term "map data" refers to the data constituting a single map, but that similar operations may be applied to the data of each a plurality of maps, held stored in a memory apparatus.

To achieve the above objectives, according to a first aspect the invention provides an electronic control apparatus having floating-point arithmetic means, and conversion means for converting values from at least one of the two constituents of the map data (i.e., a set of map values and a set of map points) from fixed-point data representation to floating-point data representation. In that way, since conversion from fixed-point representation to floating-point representation can be performed immediately prior to executing a calculation, it becomes possible for at least part of the map data stored in the memory apparatus of the electronic control apparatus to be stored in the form of fixed-point data, so that the amount of data that must be stored in the memory apparatus can be reduced by comparison with a system in which all data are stored in floating-point representation.

According to a second aspect, the invention provides such an electronic control apparatus wherein the map points in the stored map data are expressed in floating-point representation, while the stored map values are expressed as fixed-point data, with the amount of data constituting the map values being smaller than the amount of data constituting the map points. The total amount of stored data constituted by the map values is thereby reduced, due to the use of the fixed-point data representation. Furthermore since the map points are expressed in floating-point representation, it is easy to relate a wide range of values of a physical quantity to the map points with a high degree of accuracy.

According to a third aspect, the invention provides such an electronic control apparatus wherein the stored map points are expressed in fixed-point representation, with the stored map values being expressed in floating-point representation, so that the amount of data expressing the stored map values is greater than the amount of data which express the stored map points. In that case, since the map values are expressed in floating-point representation, the map values can be made to correspond to a wide range of values of a physical quantity, so that a high degree of accuracy can readily be achieved.

According to a fourth aspect, the invention provides such an electronic control apparatus wherein the stored map points and the stored map values are both expressed in fixed-point representation in the map data, and the conversion means performs conversion of both the map points and the map values from fixed-point representation to floating-point representation. In that way, the overall amount of data can be made smaller than is required when using floating-point representation.

According to a fifth aspect of the invention, with such an electronic control apparatus, the map conversion means generates floating-point data expressing a value of a physical quantity corresponding to an interpolated value of the map data, by using a predetermined value referred to as an LSB conversion value in conjunction with map data expressed in floating-point representation. The LSB conversion value is expressed in floating-point representation, and is a physical quantity value corresponding to the binary 1 value of the least significant bit in the map value data, when these data are expressed in fixed-point representation. In that way, instead of the map values being fixed-point representation data values which directly constitute respective physical quantity values, the map values can represent these physical quantity values indirectly. In the following, "corresponding to the binary 1 value of the least significant bit" will be expressed simply as "corresponding to the least significant bit".

A required physical quantity value can thereby be readily be obtained (i.e., as a final result) based on the result of an interpolation calculation performed on map values that indirectly represent physical quantity values and that have been converted to fixed-point representation for the purpose of the calculation.

According to a sixth aspect of the invention, with such an electronic control apparatus, when the map values indirectly represent respective physical quantity values, the conversion means uses the converted floating-point data to calculate an interpolated value of the map data, and uses the LSB conversion value and the calculated interpolated data to generate floating-point representation data which directly express a physical quantity value that corresponds to the interpolated value of the map data.

In that way, since conversion to data that directly express a physical quantity is executed after interpolation calculations on the map values (converted to floating-point representation) has been completed, the amount of calculation processing that is required to obtain a result (i.e., data that directly represents the required physical quantity) can be reduced, by comparison with a process whereby:

(a) firstly, each of the map values which are to be subjected to interpolation are converted to directly express respective physical quantity values (as well as being converted to floating-point representation), and then (b) the interpolation calculation is performed on the converted values, to obtain a result that directly expresses a physical quantity.

According to a seventh aspect of the invention, with such an electronic control apparatus, the apparatus includes means for providing an offset value that has been predetermined as corresponding to the map data. Generation of the floating-point data expressing a physical quantity value corresponding to an interpolated value of map data is performed by first using the LSB conversion value to convert the interpolated value to a corresponding physical quantity value, then adding thereto the predetermined offset value. By using the offset value in that way, it becomes possible to correctly represent physical quantities based on fixed-point representation data.

According to a ninth aspect of the invention, such an electronic control apparatus includes means for providing ID (identifier) data which have been predetermined as corresponding to the map data and indicate a type of fixed-point data in the map data. The conversion means performs conversion of floating-point representation data to fixed-point representation data based on the ID data. In that way, when fixed-point representation is used for the map values or for the map points of the map data, or for both of these, appropriate processing can be applied in a case in which there may be various different types of fixed-point representation data.

According to a tenth aspect of the invention, with such an electronic control apparatus the conversion means executes conversion by using a program that is written in assembler language. The program length can be reduced and the program execution speed can thereby be increased, by comparison with using a program that is written in a high-level language such as C, etc.

According to a ninth aspect of the invention, such an electronic control apparatus includes means for providing ID (identifier) data which have been predetermined as corresponding to the map data and which indicate whether or not both the map points and the map values of the map data are expressed in floating-point representation. The electronic control apparatus further includes inhibit means for inhibiting the conversion operation of the conversion means when the provided ID data indicate that both the map points and the map values expressed in floating-point representation.

In that way, appropriate operation can be achieved, in a case in which the electronic control apparatus stores map data in which both the map points and the map values are expressed by floating-point representation data.

According to a tenth aspect, the invention further provides a memory apparatus for an electronic control apparatus that executes various types of calculation and control processing in accordance with a predetermined program and having a floating-point arithmetic function, whereby the memory apparatus has the aforementioned map data and also the aforementioned ID value stored therein. 0021

According to an eleventh aspect, the invention further provides a memory apparatus for an electronic control apparatus that executes various types of calculation and control processing in accordance with a predetermined program and having a floating-point arithmetic function, wherein the memory apparatus has the aforementioned offset value stored therein.

BRIEF DESCRIPION OF THE DRAWINGS

Figure 1:
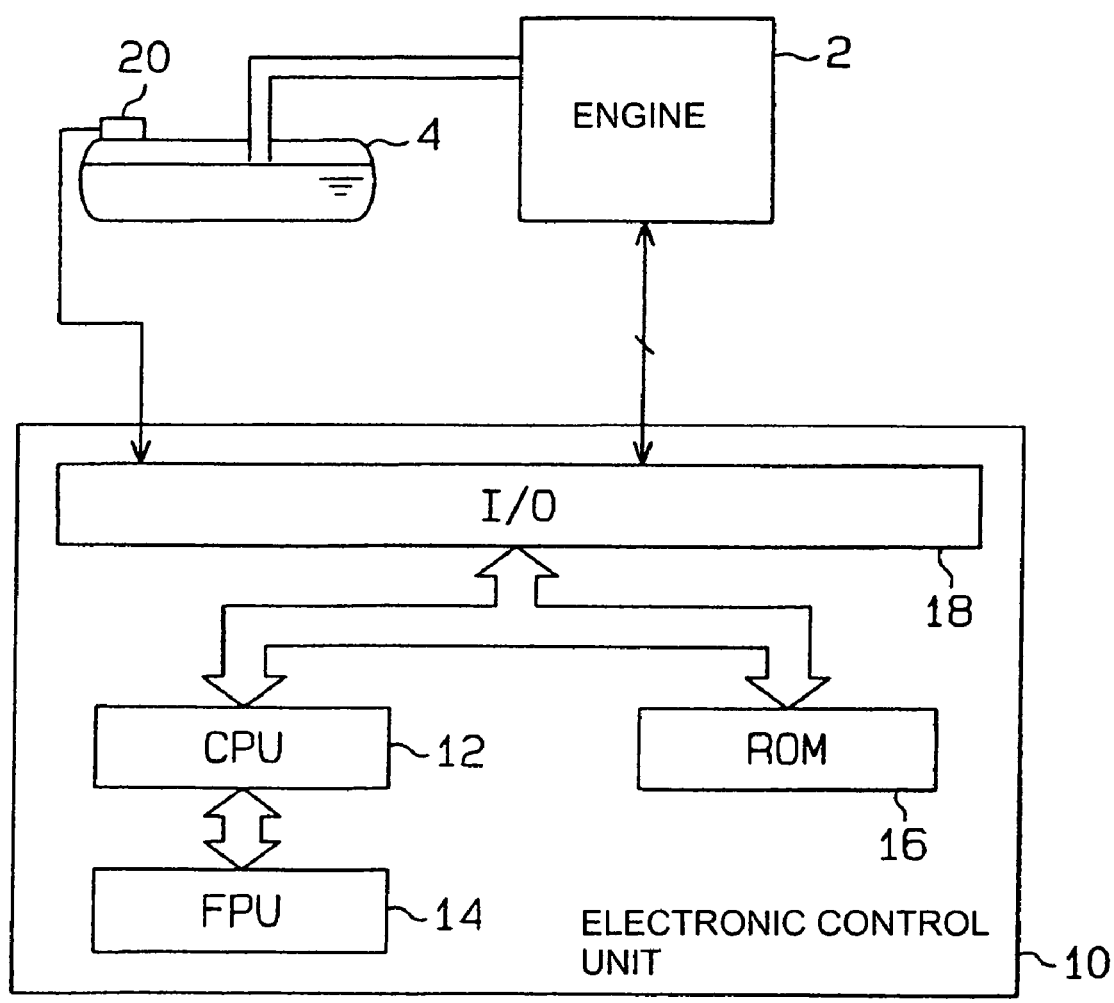
Figure 3:
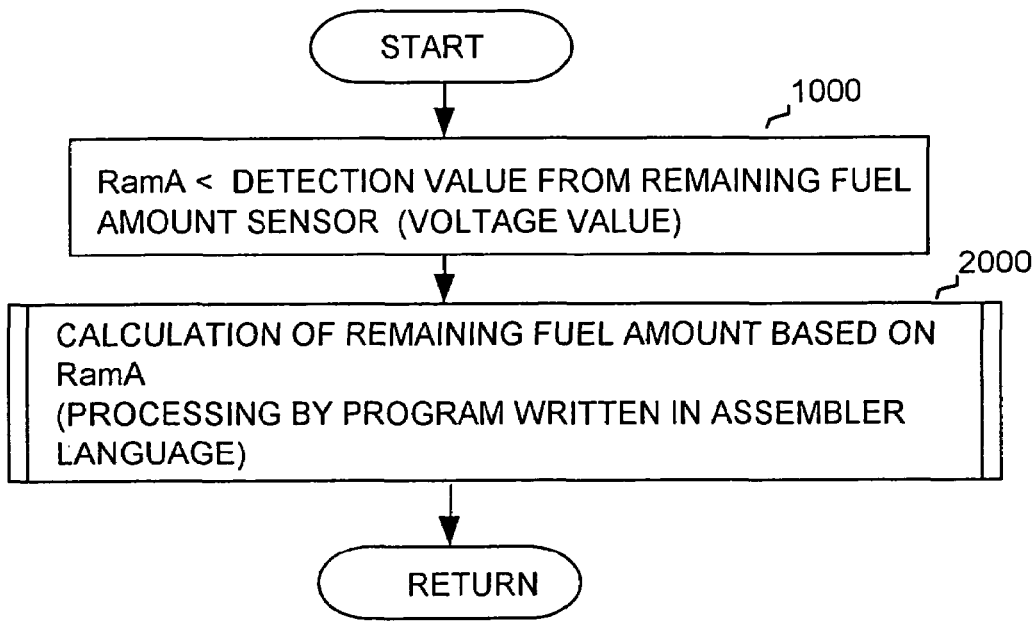
Figure 6:
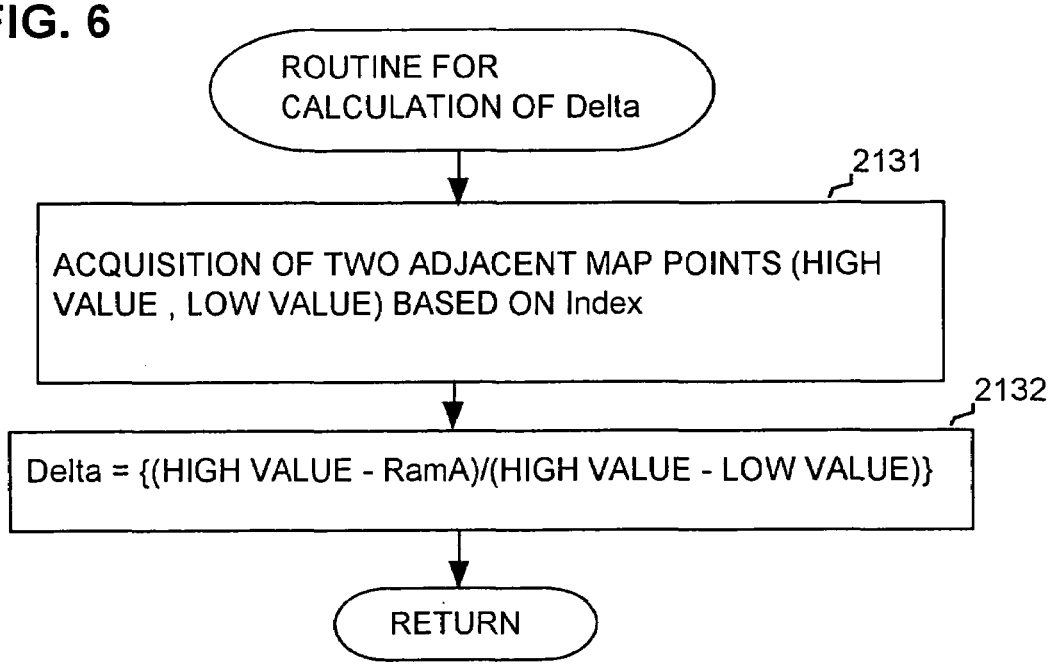
Figure 4A:
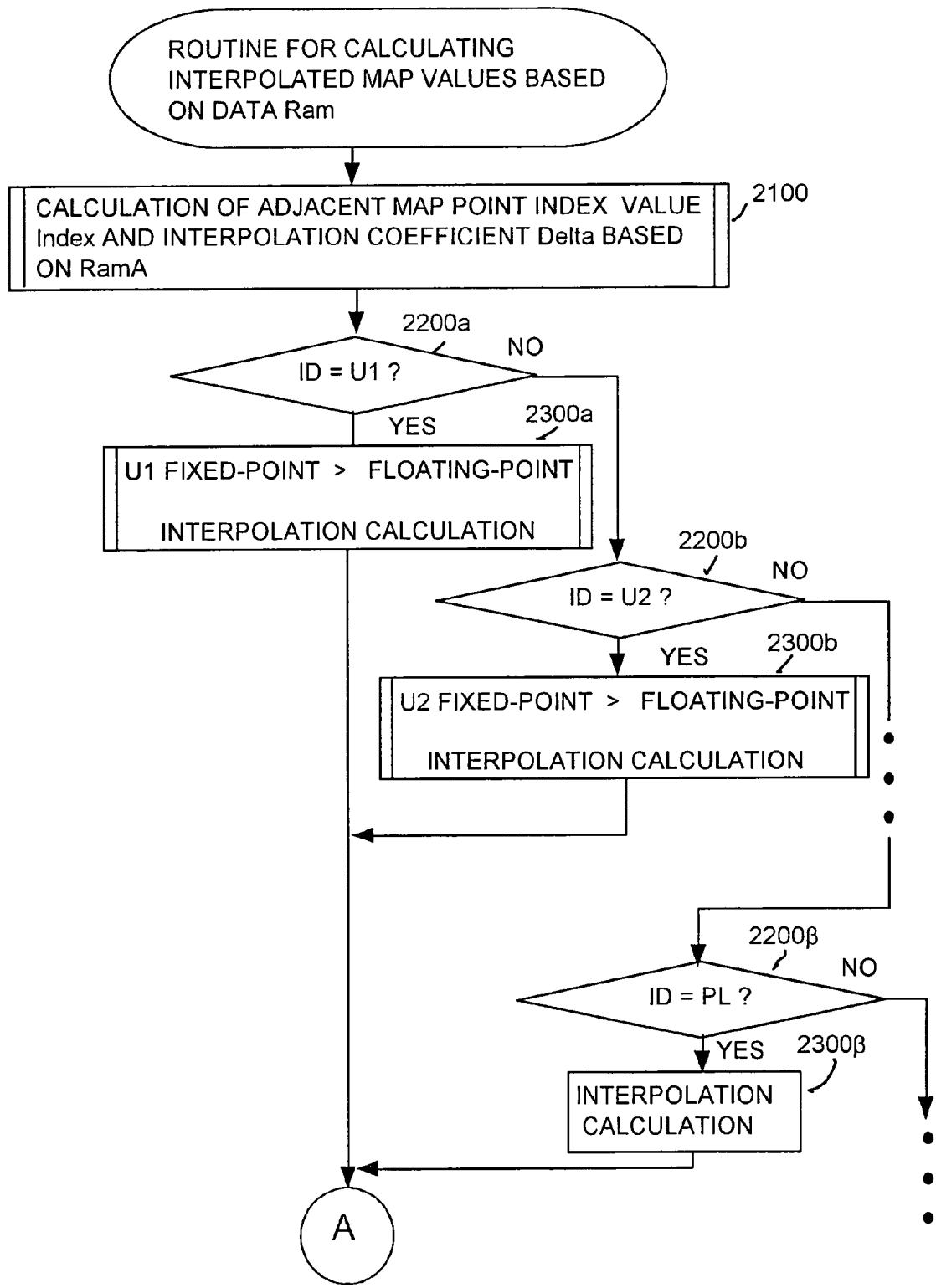
Figure 4B:
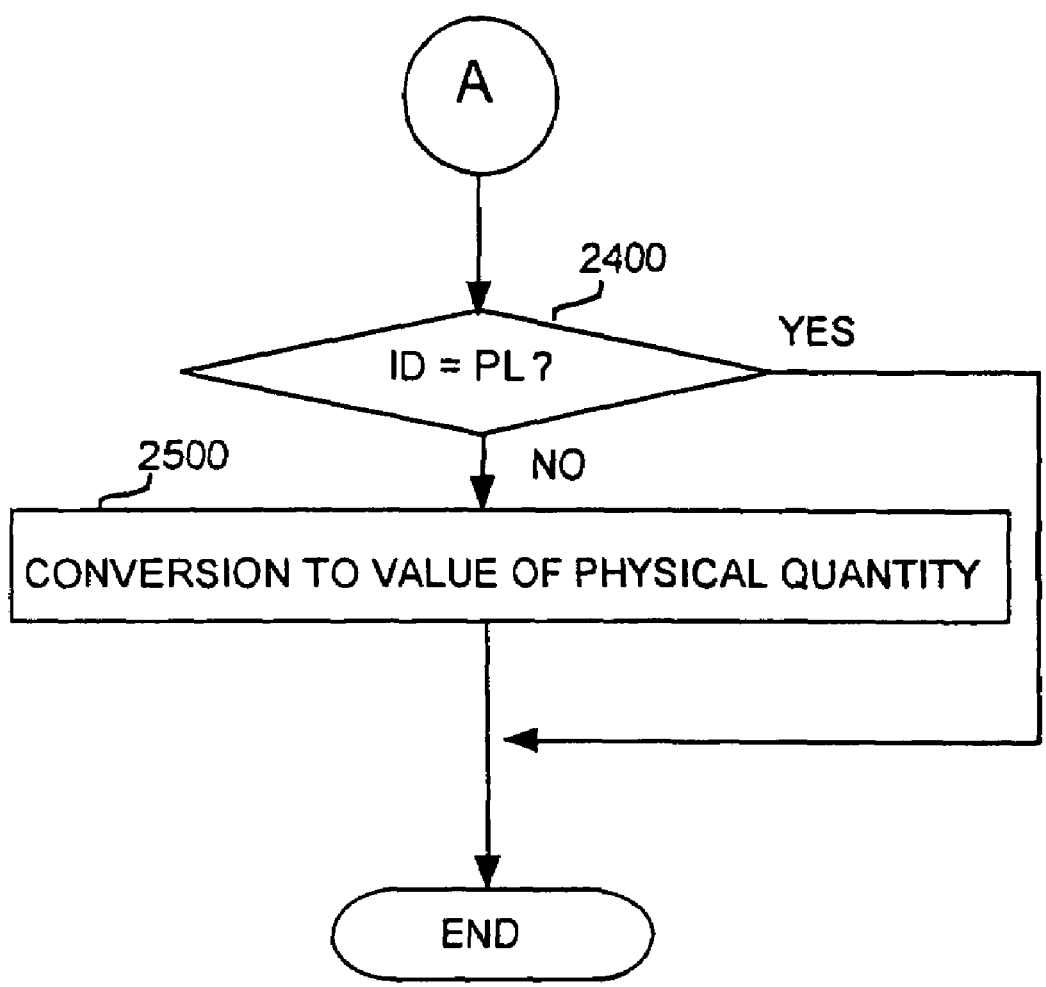
Figure 5:
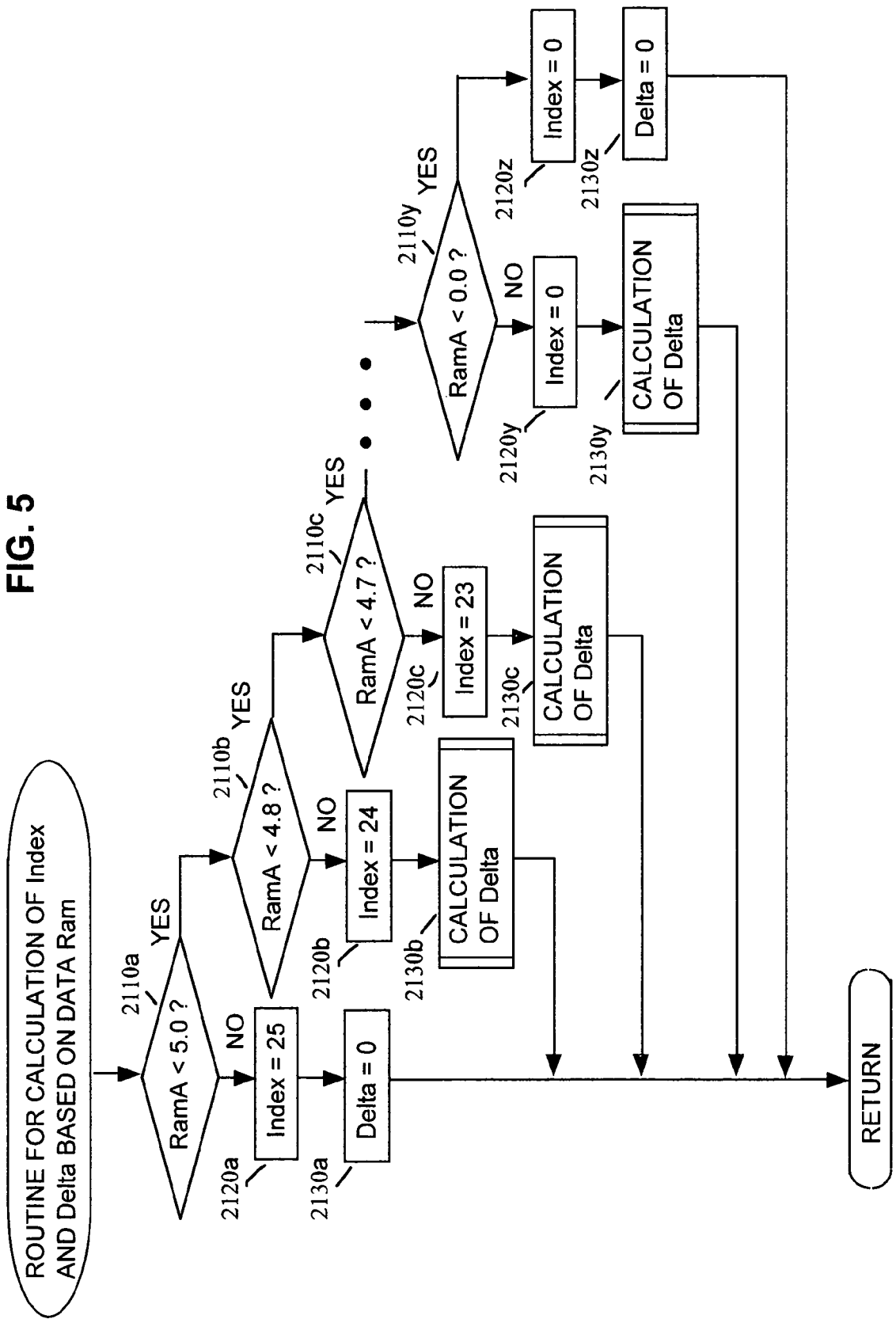
Figure 7:
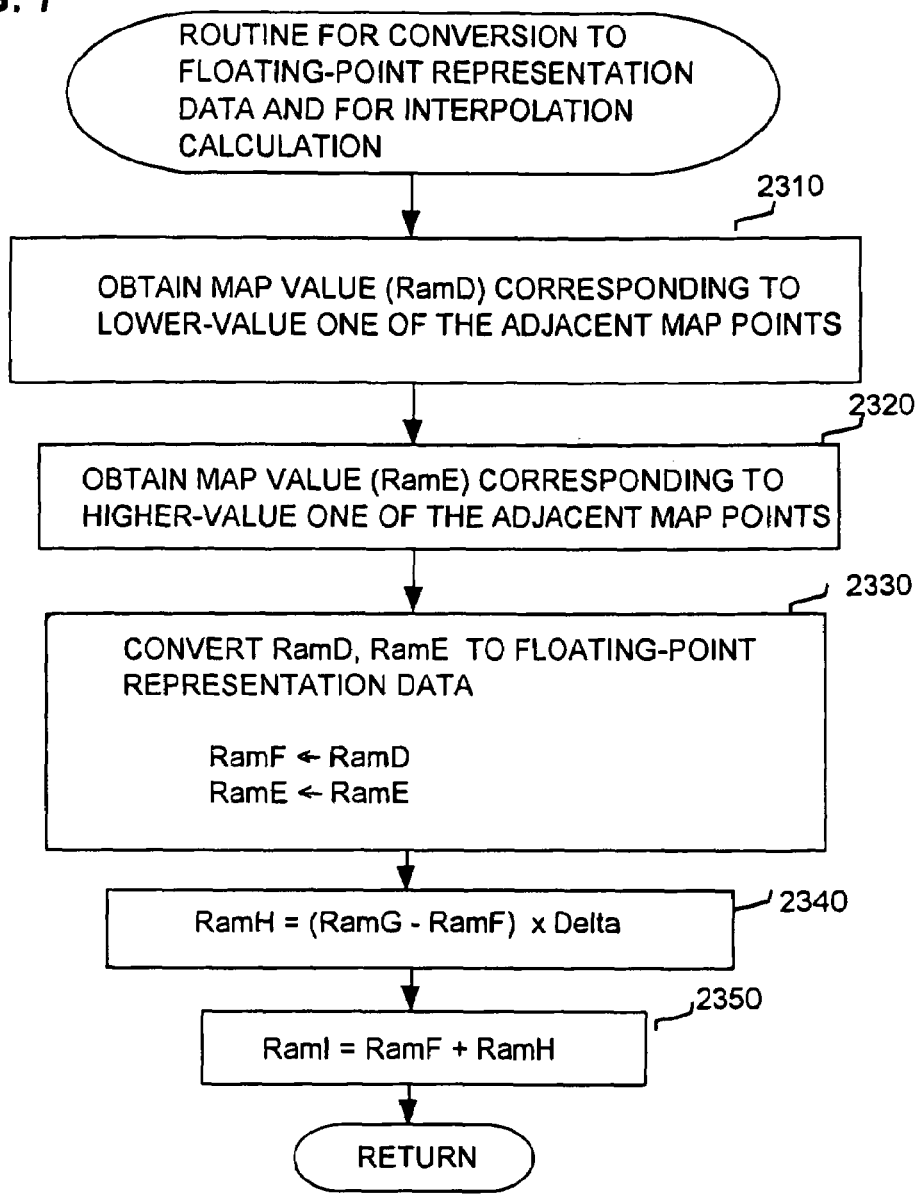

FIG. 1 is a system block diagram showing the configuration of an embodiment of an electronic control apparatus according to the present invention, FIG. 2 is a diagram showing a map which defines relationships between detection values from a remaining fuel amount sensor and remaining fuel amounts, FIG. 3 is a flow diagram of a processing sequence for calculating remaining fuel amounts, with the above embodiment, FIGS. 4A, 4B constitute a flow diagram of a processing sequence for calculation of interpolated map values, with the above embodiment, FIG. 5 is a flow diagram of a processing sequence for calculation processing to perform map value interpolation, with the above embodiment, FIG. 6 is a flow diagram of a processing sequence for calculation processing to perform map interpolation, with the above embodiment, FIG. 7 is a flow diagram of a processing sequence for performing map value interpolation calculations, with the above embodiment, and FIG. 8 shows the format of single precision floating-point representation data.

DESCRIPTION OF PREFERRED EMBODIMENTS

An embodiment of an electronic control apparatus according to the present invention, which controls a vehicle engine system, will be described in the following referring to the drawings.

FIG. 1 is a system block diagram of this embodiment, in which the electronic control apparatus 10 controls an engine system that includes an engine 2 and a fuel tank 4 from which fuel is supplied to the engine 2. The engine 2 might be for example a fuel-injection type of gasoline internal combustion engine, or a diesel engine. The electronic control apparatus 10 which controls the engine system is made up of a CPU (central processing unit) 12, a floating-point arithmetic processor 14, a ROM (read-only memory) 16, and an input/output unit 18.

The function of the CPU 12 is to perform calculations on data that are expressed in fixed-point representation. The floating-point arithmetic processor 14 performs calculations on data expressed in floating-point representation, and in particular, data in the single precision storage format such as the IEEE 754 format described above referring to FIG. 8. The ROM 16 has stored therein a program for controlling the engine system by the electronic control apparatus 10. Specifically, this program is executed by the CPU 12 and the floating-point arithmetic processor 14.

Output values constituting detection results produced from various sensors which detect the operating condition and operating environment of the engine 2, including output values produced from the remaining fuel amount sensor 20 that detects the remaining amount of fuel in the fuel tank 4, are inputted to the electronic control apparatus 10. The electronic control apparatus 10 executes various types of control of the engine system and various type of calculation based on these detection results.

A plurality of maps (where the term "map" is used as described above, to refer to map data constituted by a first set of values, i.e., map points that are related to a second set of values, i.e., map values) are also stored in the ROM 16, which are used in the calculations performed to effect the various types of control. Specifically, the ROM 16 has stored therein map data which are for use in floating-point calculations, with such calculations being performed by the floating-point arithmetic processor 14. Taking as an example the processing for deriving the remaining amount of fuel in the fuel tank 4, based on detection values produced from the remaining fuel amount sensor 20, the calculations performed with this embodiment by using the corresponding map will be described in detail in the following. The remaining amount of fuel which is thereby calculated may be outputted to a suitable display device (not shown in the drawings).

FIG. 2A shows an example of the map data stored in the ROM 16 for use in the remaining fuel amount calculation. As shown the map has 25 map points which are respective values of output voltage from the remaining fuel amount sensor 20, and 25 map values which are values of remaining fuel amount that respectively correspond to the map points.

Each of the 25 map points is stored in the ROM 16 in floating-point representation, using the format described above referring to FIG. 8. Since each of these data values corresponds to an actual value of a physical quantity, they are shown in decimal form in FIG. 2A.

The map values, on the other hand, indirectly represent respective physical quantity values as described hereinafter, and are stored in the ROM 16 as fixed-point data which will be assumed to be of U1 (unsigned 1-byte data) type. It should be noted that the "$" symbols in FIG. 2A signify hexadecimal values.

The following data are also stored in the ROM 16, in addition to the map data:

I.D. (identifier) data: this is a single byte of data, which indicates the type of data in which the map values are expressed.

LSB conversion value: this is expressed in floating-point representation, and is the value of a physical quantity that corresponds to the "1" value of the least significant bit of the fixed-point representation data of the map data. For example, the LSB conversion value corresponding to the map data of FIG. 2A is 0.4 (expressed in decimal form), i.e., representing 0.4 liter of fuel.

Offset value: This is expressed in floating-point representation, having the data format shown in FIG. 8, and is the difference between a map value that has been converted to floating-point representation and converted by using the LSB conversion value, and a corresponding correct physical quantity value. The offset value is used to obtain a final corrected value for a required physical quantity, following an interpolation calculation, as described in detail hereinafter.

In the case of the example of FIG. 2A, the offset value corresponding to the map data is 0.0 (expressed in decimal form).

By using the LSB conversion value and offset value in that way, each map value can be converted to floating-point representation data which expresses a value of a physical quantity. For example, the remaining fuel amount $8C corresponding to the sensor voltage value 0.8 is expressed in binary form as 10001100, and in decimal form as 140. This is then converted, by being multiplied by the LSB conversion value, i.e., 0.4 (expressed in decimal form) to obtain the value 56 (expressed in decimal form) and the offset value is added to thereby obtain the value of the physical quantity, i.e., 56 if the offset value is zero.

In the case of such map data being used with a prior art ECU that incorporates a floating-point arithmetic processor, both the map points and the map values are expressed in floating-point data representation, as shown in FIG. 2B. In FIG. 2B, values are shown in decimal form, for ease of understanding. As a result, 4 bytes of data are necessary to store each map point and 4 bytes of data are necessary to store each map value. Thus with the map data example of FIG. 2B, a total of 200 bytes are required.

On the other hand, with the map data of FIG. 2A, 4 bytes are necessary to express each map point, however it is only necessary to use 1 byte to express each map value. Since 1 byte is necessary to express each ID value, and 4 bytes for each LSB conversion value and offset value, the total amount of data is (25×4+25×1+1+4+4), i.e. 134 bytes.

Hence with this embodiment, a substantial amount of reduction in the total amount of map data can be achieved. It should be noted that the ROM 16 described above is not limited to using the same data format as that of FIG. 2A. For example, each map value could be expressed in fixed-point data representation, as two bytes, or both the map values and the map points could be expressed in floating-point data representation.

Calculation performed using a map in accordance with the above embodiment will be described in the following, taking as an example the map data of FIG. 2A.

FIG. 3 is a flow diagram of the processing sequence for calculating the remaining fuel amount at fixed periodic intervals.

In the first step of the processing sequence (step 1000), the detection value from the remaining fuel amount sensor 20 is converted to the floating-point data RamA by the electronic control apparatus 10, with the floating-point data format of FIG. 8 described above.

Next in step 2000, the remaining fuel amount is calculated by using the data RamA, then the processing sequence is ended. In the processing step 2000, processing is executed by using a program written in assembler language. By using assembler language, the program length can be reduced, and the program execution speed can be increased, by comparison with using a high-level program language such as C.

The processing to calculate the remaining fuel amount by using RamA will be described referring to the flow diagram constituted by FIGS. 4A, 4B, and the flow diagram of FIG. 5 which shows details of a processing step in the flow diagram of FIGS. 4A, 4B. FIGS. 4A, 4B show a sequence that is common to the processing performed using each of the maps, by the electronic control apparatus 10, i.e., the processing of FIGS. 4A, 4B is executed by a single program that is common to all of the maps. In this example, the processing is executed to calculate the remaining fuel amount which is detected by the remaining fuel amount sensor 20, using the data RamA, and the example can be considered to show details of the step 2000 of FIG. 3 above.

First, in step 2100, based on the data RamA, the two map points that are closest to the detection value are obtained from the remaining fuel amount sensor 20, and an interpolation coefficient Delta is calculated, for determining the interpolation conditions in accordance with the detection value.

Specifically, in the processing step 2100, the operations shown in FIG. 5 are executed as follows. Firstly, in the appropriate one of the steps 2110a to 2110y of the processing sequence of FIG. 5, the floating-point arithmetic processor 14 detects the map points that are closest to the data RamA. One of the set of steps 2120b to 2120z is then executed to determine the value of an adjacent map point index value Index, in accordance with the value of the data RamA. For example if the sensor voltage value is greater than 5.0, then the index value Index will be 25, if the sensor voltage value is between 5.0 and 4.8 then the index value Index will be 24, and so on, as can be understood from FIG. 5. These adjacent map point index values Index are in fixed-point data representation.

After a value for the adjacent map point index value Index has been determined, the floating-point arithmetic processor 14 executes one of the steps 2130a to 2130z, to obtain the two map points that are closest to RamA, based on the index value Index, and to obtain the interpolation coefficient Delta, for use in setting the interpolation conditions in accordance with the aforementioned detection value. Operation then returns to step 2100 shown in FIGS. 4A, 4B.

In step 2130a or step 2130z, if the map point that is defined by the detection value (i.e., data RamA) is higher than the maximum value of map point in FIG. 2A, or is smaller than the smallest value of map point in FIG. 2A, then the interpolation coefficient Delta is set to zero. On the other hand, if the data RamA is found to be between two of the map points shown in FIG. 2A, then processing is performed to calculate the interpolation coefficient Delta as shown in the flow diagram of FIG. 6, by execution of one of the steps 2130b to 2130y.

In the processing sequence of FIG. 6, in step 2131, the two map points that are closest to the detection value (data RamA) are obtained, based on the adjacent map point index value Index. For example if the detection value is 0.9 (expressed in decimal form) then the closest map points would be obtained as a high value of 1.0 and a low value of 0.8 (each expressed in decimal form). If the detection value coincides with a map point, then that map point is selected as the low value.

In step 2132, Delta is calculated by the floating-point arithmetic processor 14, using the following expression:

Delta={(high value−RamA)/(high value−low value)}

When the interpolation coefficient Delta has thus been obtained, operation returns to the main processing sequence shown in FIGS. 4A, 4B.

Next, one of the steps 2200a, 2200b, . . . 2200β is executed, in which the CPU 12 performs discrimination of the ID data, indicating the type of data that express the map values of the map that was used in step 2100. In step 2200b for example, a decision is made as to whether or not the data are fixed-point data format of two bytes (i.e., U2 data). In step 2200β, a decision is made as to whether or not the data are floating-point data.

Based on the data type information that is determined in steps 2200a, 2200b, . . . 2200β, interpolation calculation is performed in one of the steps 2300a, 2300b, . . . 2300β. Specifically, if it is determined that both the map points and the map values are expressed in floating-point representation, in step 2200β, then the floating-point arithmetic processor 14 performs interpolation processing based on the map values respectively corresponding to the two map points obtained in step 2131 of FIG. 6. In that case, (assuming that the map values directly correspond to respective physical quantity values, i.e., fuel amounts) then the interpolated value obtained by execution of step 2200β will be the desired final result. If on the other hand it is found in some step other than step 2200β that the map values are expressed in floating-point representation, then the aforementioned high value and low value map points are each converted to floating-point representation, and interpolation calculation processing is then performed.

FIG. 7 shows details of the processing that is executed when it is determined that the map values are expressed in floating-point representation.

In FIG. 7, in step 2310, the CPU 12 obtains as the data RamD, the map value corresponding to the lower-valued one of the aforementioned two closest map points that were obtained based on the adjacent map point index value Index. In step 2320, the CPU 12 obtains the data RamE, as the map value corresponding to the higher-valued one of these two closest map points.

Next in step 2330, the data RamD and the data RamE, expressed in fixed-point data representation are converted to the data RamF and RamG which are in floating-point representation.

If for example the data RamA is 0.9 (expressed in decimal form) then the data RamD becomes $8C, and the data RamE becomes $87. When the data RamD is converted to floating-point data representation, having the format of FIG. 8 described above, then it becomes [0x430c0000]. Similarly, when the data RamE is converted to floating-point data representation, then it becomes [0x43070000].

It should be noted that with the notation used for floating-point representation data herein, each number which is headed by "0x" is in hexadecimal form. Designating the sign bit as S, the exponent as E, and the mantissa as M, a floating-point data value is expressed as:

$$(-1)^s \times 2^{(E-127)} \times (1+M)$$

Hence, for example [0x430c0000] expressed in binary form is:

0100 0011 0000 1100 0000 0000 0000 0000

In this case, the sign bit S, the exponent E, and the mantissa M are:

S=0

E=10000110 (expressed in binary form)=150 (expressed in decimal form)

$$M = 0001\ 1100\ 0000\ 0000\ 0000\ 0000$$

$$= 0.00011 \text{ (expressed in binary form)}$$

$$= 3/32 \text{ (expressed in decimal form)}$$

Hence, the floating-point data express the value [140] (expressed in decimal form), which corresponds to [$8C].

When the data RamD and RamE have been respectively converted to floating-point representation as the data RamF and RamG, operation proceeds to step 2340. In this step, the floating-point arithmetic processor 14 performs linear interpolation calculation to obtain the data RamH, as follows.

RamH=(RamG−RamF)×Delta

Next, the data RamH is used in step 2350, whereby the floating-point arithmetic processor 14 calculates the data RamI by linear interpolation, as follows.

$$RamI = RamF + RamH$$

The interpolated value expressed as RamI is a logical value, where the term "logical value" herein signifies a numeric value which must be operated on by using the LSB conversion value to obtain a physical quantity value (expressed as floating-point representation data) that corresponds to the interpolation value. If it is also necessary to use an offset value, then a provisional physical quantity value is first obtained by using the LSB conversion value to operate on the interpolated value, then the offset value is added to obtain the actual physical quantity value.

The processing of step 2350 then ends, and operation returns to the main processing sequence shown in FIGS. 4A, 4B.

It should be noted that with the processing shown in FIG. 7, the system can function correctly even if the map data may include various different types of fixed-point data. This is made possible by the type information that is obtained for the fixed-point data, by means of the identification that is performed when executing one of the processing step 2200a, 2200b, etc. However in practice, it may be preferable for the processing of FIG. 7 to be executed by respectively different programs for each of the various different types of fixed-point data.

When the interpolation processing executed in one of the steps 2300a, 2300b, etc., is completed, operation proceeds to step 2400. In step 2400, a decision is made as to whether or not the ID data indicate floating-point representation data.

If it is judged in step 2400 that the ID data do not indicate that the map values are expressed by floating-point representation data, then step 2500 is executed, in which the floating-point arithmetic processor 14 performs conversion of the interpolated result to a corresponding physical quantity value (i.e., fuel amount). This is done by using the following expression, employing the data RamI obtained in step 2350 of FIG. 7 above, the LSB conversion value, and the offset value.

$$RamI \times LSB + (\text{offset value})$$

In that way, although interpolation calculations are performed using values expressed in floating-point representation which do not directly correspond to physical quantity values, the result of such an interpolation calculation can be easily converted to a correct physical quantity value.

Furthermore, since conversion to a physical quantity value expressed is performed after the interpolation calculation has been completed, rather than converting each of the aforementioned high and low values to directly represent respective physical quantity values before performing the interpolation calculation, the processing load constituted by the sequence of operations shown in FIGS. 4A, 4B can be reduced.

When the processing of step 2500 has been completed, or it has been judged in step 2400 that the ID data indicate that both the map points and the map values are expressed in floating-point representation, then the processing sequence is ended.

If step 2300β is executed, the floating-point conversion step 2330 shown in FIG. 7 is omitted (since the map values are already expressed in floating-point representation), and the interpolated value that is calculated in step 2300β is a physical quantity value. Thus if it is judged in step 2400 that the ID data indicates that both the map points and the map values are expressed in floating-point representation, then the processing of step 2500, for conversion of an interpolation result to a value directly representing a physical quantity, is omitted.

It can thus be understood from the above that with this embodiment of the invention, map values of predetermined map data are expressed as fixed-point representation data, and so constitute a smaller amount of data than would be the case if they were expressed as floating-point representation data. Hence, the overall amount of the map data can be reduced. However when interpolation calculation is to be performed, the requisite map values are first converted from fixed-point to floating-point representation data. Thus the advantages of using floating-point representation data can be obtained.

It can be understood that the interpolated values obtained using map values that are stored as fixed-point representation data, with the above embodiment, are identical to those which would be obtained if the map data were to be held stored as floating-point representation data. Thus, by comparison with the case in which all of the map data are held as fixed-point representation data, so that the CPU 12 operates only on fixed-point data, an increase in interpolation accuracy can be obtained with the above embodiment.

The processing for calculating interpolated map values shown in FIGS. 4A, 4B can be applied in common to each of a plurality of different maps that may be each be held stored in the ROM 16. Hence, the amount of data constituting the program for performing map value interpolation can be reduced.

Moreover with the processing of FIGS. 4A, 4B, since it is possible to distinguish between different types of data (by means of the ID data) the program can be utilized substantially unchanged even if the type of map data is altered, or can be used for each of a plurality of maps which may use various different types of data. For example, it is only necessary to redefine the ID data, when the type of data used in a specific map is changed.

The effects obtained with the above embodiment can be summarized as follows:

(1) Although the map values are stored as fixed-point representation data, these values are converted to floating-point representation data before they are used in a calculation. In that way, the total amount of data constituting the map data can be reduced.

(2) While the map points are expressed in floating-point data representation, the map values are expressed in fixed-point data representation. Hence the amount of data constituting the map values can be made smaller than the amount of data constituting the map points. Furthermore since the map points are expressed in floating-point data representation, the map points can be made to corresponding to a wide range of physical quantities, with these physical quantities being readily represented to a high degree of accuracy.

(3) The result obtained from an interpolation calculation that has been performed on map values which have been converted from fixed-point representation to floating-point representation (and which only indirectly represent actual physical quantity values) can easily be converted to a required final result that directly represent a physical quantity value, by applying the LSB conversion value as described hereinabove. Thus the invention is advantageous with respect to utilizing indirect representation for physical quantity values, stored as map values in a memory apparatus such as the ROM 16.

(4) If necessary, an offset value can also be applied, for obtaining a final result directly representing a physical quantity value, based on map values that are expressed in fixed-point representation.

(5) After performing interpolation calculation on map values which indirectly express actual physical quantity values and have been converted to floating-point representation, the result is converted to data that directly represent a physical quantity value. By comparison with a method whereby map values which indirectly express actual physical quantity values are converted to directly express corresponding physical quantity values prior to performing the interpolation calculation, the amount of processing that is required is substantially reduced.

(6) Fixed-point representation data are converted to floating-point representation data based on the ID data, which indicate the data type in which the map values are expressed. In that way, various types of data can be used to express the map values with respectively appropriate processing being performed for each of the various types.

(7) The processing of FIGS. 4A, 4B to 7 is executed by a program that is written in assembler language. As a result, the program length can be reduced, by comparison with a program which is written in a high-level language, and the processing speed increased.

The following modifications could be envisaged for the above embodiment:

With the above embodiment, only the fixed-point data types U1 and U2 have been described, however the invention is not limited to these. For example, S1 (signed 1-byte data) or S2 (signed 2-byte data), etc., could also be used as the fixed-point representation data.

The embodiment could be limited to using only map values that are expressed in fixed-point representation data. In that case, it becomes unnecessary to provide means for determining whether or not both the map points and the map values data are in floating-point representation (e.g., steps 2200β and 2400 in the processing sequence of FIGS. 4A, 4B) or for performing interpolation calculation when the data are in floating-point representation (step 2300β), etc.

If only map data that are expressed in single precision floating-point representation are to be handled, then it becomes unnecessary to perform the processing for discriminating the information indicating the type of map value data, i.e., the ID data become unnecessary.

The aforementioned effect (1) of the above embodiment could also be obtained if the map values are converted to physical quantity values by processing that uses the LSB conversion value etc., prior to performing the interpolation calculation.

If the map values can be accurately converted to directly express respective physical quantity values by using the LSB conversion value, then it is unnecessary to use the offset value.

If the map values are expressed by fixed-point representation, and correspond directly to respective physical quantity values, then it is not necessary to use the LSB conversion value. However in that case, the interpolation accuracy could be increased by converting the map values to floating-point representation before executing an interpolation calculation.

With the above embodiment, the map point data are expressed in floating-point representation, while the map value data are expressed in fixed-point representation. However it would be equally possible for the map value data to be expressed in floating-point representation, and for the map point data to be expressed in fixed-point representation. In that case, the map points would be converted to floating-point representation before performing the interpolation calculations, to increase the accuracy of the interpolated values. In addition, the aforementioned LSB conversion value would be provided. In that way, correct relationships would be established between the map points and the floating-point representation data that express the physical quantity values. Furthermore if necessary, an appropriate offset value could be applied to establish accurate relationships between the results of interpolation calculations and the floating-point representation data (map values) that express physical quantity values. Such use of floating-point representation for the map values would be especially effective when it is required that the map values corresponding to map points are to cover a wide range, and when it is desired to represent extremely small values.

Both the map points and the map values could be expressed by fixed-point representation. In that case, the system would be configured such that both the map points and the map values are converted to floating-point representation for the purposes of calculation, so that accurate interpolated values could be calculated. This would enable the amount of data constituting the entire map data to be further reduced.

The method of performing interpolation of the map values is not limited to the linear interpolation method of the above embodiment. In addition, the present invention is not limited to the use of a single precision storage format for the floating-point representation data, and for example a double precision storage format could be used.

The present invention is not limited to a system having a CPU and a floating-point arithmetic processor, such as those of the above embodiment, as conversion means for converting the map points and/or the map values from fixed-point representation to floating-point representation. For example, it would be equally possible to use a configuration with a floating-point arithmetic processor and dedicated hardware. Furthermore, it is not essential that the conversion means be implemented as a program that is written in assembler language.

The invention is not limited to the use of a ROM as a memory apparatus for storing the map data, LSB conversion value, and offset values, etc.

The invention is not limited to an electronic control apparatus for performing various calculations and control operations in accordance with a predetermined program and having a floating-point arithmetic function, that is applied to engine system control. For example, such an apparatus could be applied to control other equipment of a vehicle.

It should thus be understood that although the invention has been described with respect to a specific embodiment, various modifications and alternative configurations could be envisaged, which fall within the scope claimed for the invention as set out in the appended claims.

What is claimed is:

1. An electronic control apparatus which incorporates a floating-point arithmetic function and performs types of calculation and control operations in accordance with a predetermined computer program, said apparatus comprising:

a computer;

a memory having stored therein map data that comprises a set of map points expressed in floating-point representation and a set of map values respectively corresponding to said map points and expressed in fixed-point representation;

means for outputting a calculated value of a physical quantity, derived from said map data based on an inputted fixed-point representation value; and conversion means implemented by executing a computer program on said computer adapted to operate on said map data to selectively convert at least one of said map values from fixed-point representation to floating-point representation data, wherein:

said set of map values indirectly represent respective values of said physical quantity, and data expressing said set of map values are of smaller amount than data which express said set of map values;

said conversion means comprises means for providing a LSB (least significant bit) conversion value as a floating-point representation value which directly represents a specific value of said physical quantity, with said specific physical quantity value having been predetermined as corresponding to a LSB (least significant bit) of said set of map values; and said conversion means is adapted to respond to said inputted floating-point representation value by:

selecting a pair of map points that are respectively close to said inputted floating-point representation value and that correspond to a specific pair of said map values, and calculating an interpolation coefficient corresponding to said selected pair of map points, converting said specific pair of map values to respective floating-point representation values, interpolating between said converted pair of map values by a floating-point calculation utilizing said interpolation coefficient, to obtain an interpolated floating-point value; and operating on said interpolated floating-point value with said LSB conversion value, for obtaining a value to be outputted as said calculated value of the physical quantity derived from said map data.

2. An electronic control apparatus according to claim 1 comprising means adapted to provide data expressing an offset value that has been predetermined as corresponding to said set of map values, wherein said interpolated floating-point value is obtained as a logical value, and wherein conversion means is adapted to:

operate on said logical value with said LSB conversion value, to obtain a provisional value of said calculated value of said physical quantity, and add said offset value to said provisional value, to obtain said floating-point representation calculated value of said physical quantity derived from said map data.

3. An electronic control apparatus according to claim 1, further comprising:

means for providing ID (identifier) data which express a type of said fixed-point representation data, wherein said conversion means performs conversion of said floating-point representation data to said fixed-point representation data based on said ID data.

4. An electronic control apparatus according to claim 1 wherein said conversion means executes said conversion by using a program that is written in assembler language.

5. An electronic control apparatus according to claim 1, comprising:

means for providing ID (identifier) data which have been predetermined as corresponding to said map data and which indicate whether or not both said map points and said map values of said map data are expressed in floating-point representation, and means for inhibiting said conversion operation of said conversion means when said ID data indicate that both said map points and said map values are expressed in floating-point representation.

6. An electronic control apparatus which incorporates a floating-point arithmetic function and performs calculation and control operations in accordance with a predetermined computer program, said apparatus comprising:

a memory having stored therein map data that comprise a set of map points that are expressed in fixed-point representation and a set of map values respectively corresponding to said map points and expressed in floating-point representation, means for outputting a calculated value derived from said map data based on an inputted floating-point representation value of a physical quantity, and conversion means implemented by executing said computer program, adapted to operate on said map data to convert said map points from fixed-point representation to floating-point representation data, wherein:

said set of map points indirectly represent respective values of said physical quantity, and data expressing said set of map points are of smaller amount than data which express said set of map values;

said conversion means comprises means for providing a LSB (least significant bit) conversion value expressed in floating-point representation, directly representing a value of said physical quantity that has been predetermined as corresponding to a LSB of said set of map points; and said conversion means is adapted to respond to said inputted convert at least one of said map points to floating-point representation value by:

converting said map pints to respective floating-point representation map points, multiplying each of said floating-point representation map points by said LSB conversion value to obtain respectively corresponding values of said first quantity, and selecting a pair of said corresponding physical quantity values that are respectively close to said inputted floating-point representation value and that correspond to a specific pair of said map values, calculating an interpolation coefficient corresponding to said selected pair of physical quantity values, and interpolating between said specific pair of map values by a floating-point calculation utilizing said interpolation coefficient, for obtaining a value to be outputted as said calculated value derived from said map data.

7. An electronic control apparatus according to claim 6, further comprising:

means for providing data expressing an offset value that has been predetermined as corresponding to said set of map points, wherein said conversion means is adapted to:

obtain respective provisional values of said first physical quantity by multiplying said map points by said LSB conversion value, and to obtain said respectively corresponding values of the first physical quantity by adding said offset value to each of said provisional values.

* * * * *

UNITED STATES PATENT AND TRADEMARK OFFICE
CERTIFICATE OF CORRECTION

| | |
|---|---|
| PATENT NO. | : 7,558,811 B2 |
| APPLICATION NO. | : 10/764583 |
| DATED | : July 7, 2009 |
| INVENTOR(S) | : Kazuhiro Koto et al. |

It is certified that error appears in the above-identified patent and that said Letters Patent is hereby corrected as shown below:

Col. 14, line 30: delete "convert at least one of said map points to".

Col. 14, line 32: change "pints" to -- points --.

Signed and Sealed this

Sixteenth Day of March, 2010

David J. Kappos
*Director of the United States Patent and Trademark Office*